United States Patent
Shin et al.

(10) Patent No.: US 7,297,604 B2
(45) Date of Patent: Nov. 20, 2007

(54) SEMICONDUCTOR DEVICE HAVING DUAL ISOLATION STRUCTURE AND METHOD OF FABRICATING THE SAME

(75) Inventors: Hwa-Sook Shin, Suwon-shi (KR); Soo-Cheol Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 299 days.

(21) Appl. No.: 11/154,385

(22) Filed: Jun. 16, 2005

(65) Prior Publication Data

US 2005/0233541 A1    Oct. 20, 2005

Related U.S. Application Data

(62) Division of application No. 10/379,243, filed on Mar. 4, 2003, now Pat. No. 6,927,452.

(30) Foreign Application Priority Data

Mar. 5, 2002    (KR) .................................. 02-11623

(51) Int. Cl.
*H01L 21/762* (2006.01)

(52) U.S. Cl. ...................... 438/296; 438/425; 438/433; 257/E21.551

(58) Field of Classification Search ................ 438/221, 438/296, 425, 433; 257/E21.551
See application file for complete search history.

(56) References Cited

U.S. PATENT DOCUMENTS

| | | | |
|---|---|---|---|
| 4,506,435 A * | 3/1985 | Pliskin et al. ................. | 438/296 |
| 4,529,456 A * | 7/1985 | Anzai et al. ................. | 438/234 |
| 4,903,109 A | 2/1990 | Kooi ............................ | 357/50 |
| 4,926,233 A | 5/1990 | Hutter .......................... | 357/43 |
| 5,156,989 A | 10/1992 | Williams et al. ............... | 437/41 |
| 5,356,822 A | 10/1994 | Lin et al. ....................... | 437/34 |
| 5,436,189 A * | 7/1995 | Beasom ....................... | 438/430 |
| 5,485,027 A | 1/1996 | Williams et al. ............ | 257/343 |
| 5,925,910 A | 7/1999 | Menegoli ..................... | 257/335 |
| 5,937,297 A * | 8/1999 | Peidous ....................... | 438/270 |
| 6,069,034 A | 5/2000 | Gregory ....................... | 438/201 |
| 6,100,159 A * | 8/2000 | Krivokapic ................. | 438/413 |
| 6,417,050 B1 * | 7/2002 | Saito ........................... | 438/270 |
| 6,762,477 B2 | 7/2004 | Kunikiyo ..................... | 257/506 |
| 2001/0021559 A1* | 9/2001 | Norstrom et al. ........... | 438/296 |
| 2001/0050412 A1 | 12/2001 | Patti ............................ | 257/565 |
| 2003/0168698 A1 | 9/2003 | Shin et al. ................... | 257/335 |

FOREIGN PATENT DOCUMENTS

| | | |
|---|---|---|
| JP | 61-150231 A | 7/1986 |
| JP | 08-148553 A | 6/1996 |

* cited by examiner

*Primary Examiner*—George Fourson
(74) *Attorney, Agent, or Firm*—Mills & Onello LLP

(57) ABSTRACT

In a semiconductor device having a dual isolation structure, and a method of fabricating the same, an epitaxial layer is formed on the entire surface of the semiconductor device. A device region including the semiconductor device and the epitaxial layer is defined by a device isolation layer. The device isolation layer has a dual structure that includes a diffused isolation layer and a trench isolation layer. The diffused isolation layer is formed in the semiconductor substrate, and surrounds the base and the bottom sidewall of the device region, and the trench isolation layer surrounds the upper sidewall of the device region by vertically penetrating the epitaxial layer. The method of fabricating a semiconductor device is performed by forming a diffused bottom isolation layer at a predetermined region in the semiconductor substrate, and forming a trench exposed at a predetermined region of the semiconductor substrate by patterning the epitaxial layer formed on the entire surface of the semiconductor substrate. A diffused isolation wall is formed to be connected to the diffused bottom isolation layer under the trench. A trench isolation structure is formed to be connected to the diffused isolation wall by filling an insulating layer inside the trench.

17 Claims, 12 Drawing Sheets

SEMICONDUCTOR DEVICE HAVING DUAL ISOLATION STRUCTURE AND METHOD OF FABRICATING THE SAME

RELATED APPLICATIONS

This application is a divisional of U.S. application Ser. No. 10/379,243, filed on Mar. 4, 2003, now U.S. Pat. No. 6,927,452, which relies for priority upon Korean Patent Application No. 02-11623, filed on Mar. 5, 2002, the contents of which are herein incorporated by reference in their entirety.

BACKGROUND OF THE INVENTION

1. Field of the Invention

The present invention relates to a semiconductor device and a method of fabricating the same, and more particularly, to a semiconductor device having a dual isolation structure and a method of fabricating the same.

2. Discussion of the Related Art

In the semiconductor arts, there continues to be an ever-increasing demand for a high level of power transmission, for high speed switching ability during power conversion, and for various applications of power IC products in power control systems. Power IC products are widely used in automotive electronic componentry as well as in hard disk drive (HDD) and in video tape recording (VTR) systems. Double-diffused MOS transistors (DMOS Tr) offer the combination of high-current processing ability and low on-resistance per surface area; therefore DMOS transistors are an important element of the power IC in the processing of high voltages.

Since the DMOS device is operated at high voltage, a device isolation layer having a high breakdown voltage is required between adjacent DMOS devices or between the DMOS device and other control circuits. Conventionally, junction isolation technology using an impurity-diffused layer for device isolation was employed for this purpose. However, in the case of junction isolation technology, the junction isolation structure requires a wide surface area in order to form deep device isolation structures, as the structure of the DMOS device requires thick epitaxial layers. In order to overcome this limitation, there has been introduced a method of forming a trench device isolation structure. U.S. Pat. No. 5,356,822, entitled "Method for making all complementary BICDMOS devices" introduces a method of isolating devices by forming a DMOS device on a silicon on insulator (SOI) substrate.

FIG. 1 is a sectional view of a conventional DMOS device having a device isolation structure employing the junction isolation technology.

Referring to FIG. 1, a DMOS device of the junction isolation structure includes a semiconductor substrate 1, a first conductivity type buried layer 6 placed on a predetermined region of the semiconductor substrate 1, and a second conductivity type buried layer 2 slightly spaced apart from the first conductivity type buried layer 6 and surrounding the buried layer 6. A first conductivity type epitaxial layer 8 is deposited on the entire surface of the first conductivity type layer 6, the second conductivity type layer 2, and the semiconductor substrate 1. The epitaxial layer 8 is more lightly doped than the first conductivity type buried layer 6. A second conductivity type junction isolation layer 4 is connected to the second conductivity type buried layer 2 while surrounding a predetermined region of the epitaxial layer 8. The junction isolation layer 4 and the second conductivity type buried layer 2 form a device isolation structure 5 of the DMOS device. The device isolation structure 5 defines the device region of the DMOS device. A field oxide layer 16 is placed in a predetermined region of the device region surrounded by the device isolation structure 5 to define a first active area and a second active area. The field oxide layer 16 surrounds the first active area spaced apart from the device isolation structure 5. A gate electrode 14 is placed on the first active area with a gate insulating layer 22 interposed there between. A source region is formed in the first active area adjacent to the gate electrode 14, and a drain region is formed in the second active area. The source region 26 includes a first conductivity type diffused layer 18 formed on the surface of the first active area adjacent to the gate electrode 14, a second conductivity type diffused layer 20 spaced apart from the gate electrode 14 adjacent to the first conductivity type diffused layer 18, and a second conductivity type body region 26 surrounding the first conductivity type diffused layer 18 and the second conductivity type diffused layer 20. The drain region includes a sink region 10 vertically penetrating the epitaxial layer 8 and connected to the first conductivity type buried layer 6, and a heavy doped region 12 formed on the surface of the second active area on the sink region 10. A field oxide layer 15 is further formed on the junction isolation layer 4 for device isolation.

Normally, the breakdown voltage of the DMOS device is proportional to the thickness of the epitaxial layer 8. That is, the epitaxial layer 8 is typically formed to have a thickness of over 10 μm, in order to provide a high breakdown voltage in the DMOS device. Therefore, when forming the second conductivity type junction isolation layer 4 through the thick epitaxial layer 8, and considering the diffusion of the impurity to form the second conductivity type junction isolation layer 4, the junction isolation layer and the drain region should be positioned a suitable distance apart. As a result, the area size occupied by the device isolation structure in the DMOS device employing the junction isolation technology is over 25% of the entire device region.

FIG. 2 is a sectional view of a DMOS device having a trench device isolation structure that was introduced in order to overcome the above-mentioned limitations in the traditional junction isolation structures.

Referring to FIG. 2, as in the junction isolation structures described above, a DMOS device having a trench device isolation structure includes a first conductivity type buried layer 36 formed on a semiconductor substrate 31, an epitaxial layer 38 covering the buried layer 36 and the semiconductor substrate 31, a gate electrode 34 formed on the epitaxial layer 38, a source region and a drain region. The source region and the drain region have the same structure as the corresponding parts of the DMOS device having the junction isolation structure. That is, the source region includes a first conductivity type diffused layer 48, a second conductivity type diffused layer 30, and a second body region 44. The drain region includes a sink region 40 connected to the buried layer 36, and a heavy doped region 42 formed on the upper side of the sink region 40. A device isolation structure 32 is placed to penetrate a portion of the epitaxial layer 38 and the semiconductor substrate 31. The device isolation structure 32 defines the device region. A field oxide layer 46 is placed on a predetermined region of the device region surrounded by the device isolation structure 32 to thereby define the first active area and the second active area. The gate electrode 34 and the source region are placed on the first active area surrounded by the field oxide layer 46. The drain region is placed in the second active area between the field oxide layer 46 and the device isolation structure 32.

As described above, the device isolation structure 32 is more deeply formed than the first conductivity type buried layer, in order to isolate between neighboring DMOS devices and between the DMOS devices and other control circuits. That is, the device isolation structure 32 has a thickness over about 20 μm in the DMOS device having a working voltage of about 70 V. However, there is a limit in forming the deep trench device isolation structure in such a small area because of difficulties in the etching and burying processes.

SUMMARY OF THE INVENTION

Accordingly, the present invention is directed to a semiconductor device and a method of fabricating semiconductor devices that substantially obviate one or more of the limitations and disadvantages of the related art.

A feature of the present invention is to provide a semiconductor device and a method of fabricating the same having a much-improved isolation structure that provides for enhanced device isolation ability.

Another feature of the present invention is to provide a semiconductor device and a method of fabricating the same having a device isolation structure in which the area required for device isolation is relatively small as compared to the area occupied by the device region.

In accordance with the purpose of the invention, as embodied and described herein, a semiconductor device having a dual isolation structure is provided in accordance with the present invention. The device includes a semiconductor substrate and a first conductivity type epitaxial layer on the surface of the semiconductor substrate.

The device region including the semiconductor substrate and the epitaxial layer is defined by the device isolation structure. A double-diffused MOS transistor (DMOS Tr.) is placed in the device region. The device isolation structure has a dual structure including a diffused isolation layer and a trench isolation layer. The diffused isolation layer is formed in the semiconductor substrate, and surrounds the base and the bottom sidewall of the device region, and the trench isolation layer vertically penetrates the epitaxial layer and surrounds the upper sidewall of the device region. Inside the device region, there may be formed a high frequency bipolar transistor or high voltage control circuit, etc.

According to one embodiment of the present invention, a first conductive buried layer may be interposed at a predetermined region between the semiconductor substrate and the epitaxial layer of the device region, and on the epitaxial layer of the device region may be placed a field oxide layer to define a first active area and a second active area. In addition, a gate electrode is placed on the first active area, and a source region and a drain region may be placed inside the first active area and the second active area respectively. A vertical double diffused MOS transistor includes the gate electrode, the source region, the drain region, the buried layer, and the epitaxial layer between the buried layer and the source region. The source region includes a second conductive body region and a heavy doped first conductive diffused layer formed on the body region.

In another aspect of the present invention, there is provided a method of fabricating a semiconductor device having a double isolation structure. The method includes the steps of forming a diffused bottom isolation layer by implanting a second conductive impurity into a predetermined region of a semiconductor substrate, and forming a first conductive epitaxial layer on the semiconductor substrate. The epitaxial layer is patterned to form a trench exposed at a predetermined region of the semiconductor substrate, and a diffused isolation wall is formed which is connected with the diffused bottom isolation layer by injecting a second conductive impurity into the lower side of the trench. The diffused bottom isolation layer and the diffused isolation wall form the diffused isolation layer. A trench isolation structure is formed which is in contact with the diffused isolation wall by filling an insulating layer inside the trench. The trench isolation structure and the diffused isolation layer form the device isolation structure to define a device region which is formed by the sequentially deposited semiconductor substrate and epitaxial layer.

In another aspect of the present invention, a method of fabricating a semiconductor device further may include the steps of forming a first conductivity type buried layer by implanting a first conductivity type impurity into the surface of the semiconductor substrate on the diffused bottom isolation layer after forming the diffused bottom isolation layer. In addition, a field oxide layer to define the first active area and the second active area may be formed on the upper side of the epitaxial layer of the device region after defining the device region. A gate electrode and a source region are formed on the first active area, and a drain region is formed in the second active area. As a result, a vertical double diffused MOS transistor is formed in the device region.

It is to be understood that both the foregoing general description and the following detailed description of the present invention are exemplary and explanatory and are intended to provide further explanation of the invention as claimed.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
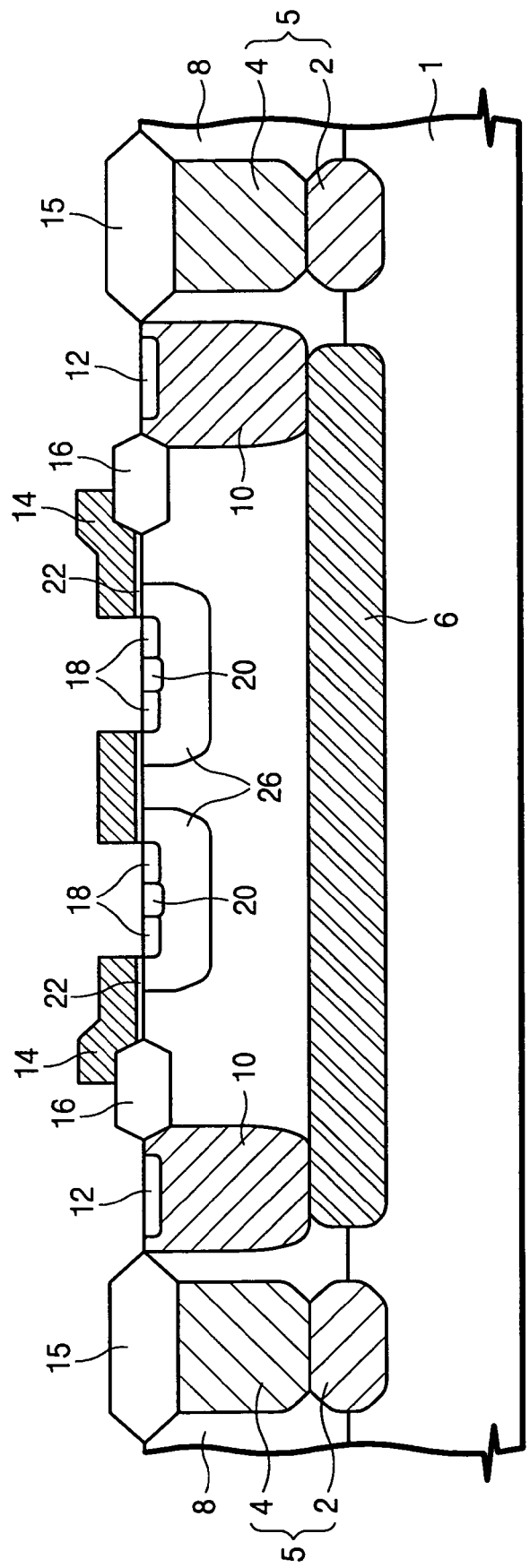
FIG. 1 is a sectional view of a conventional DMOS device having a device isolation structure manufactured by employing a junction isolation technology.
Figure 2:
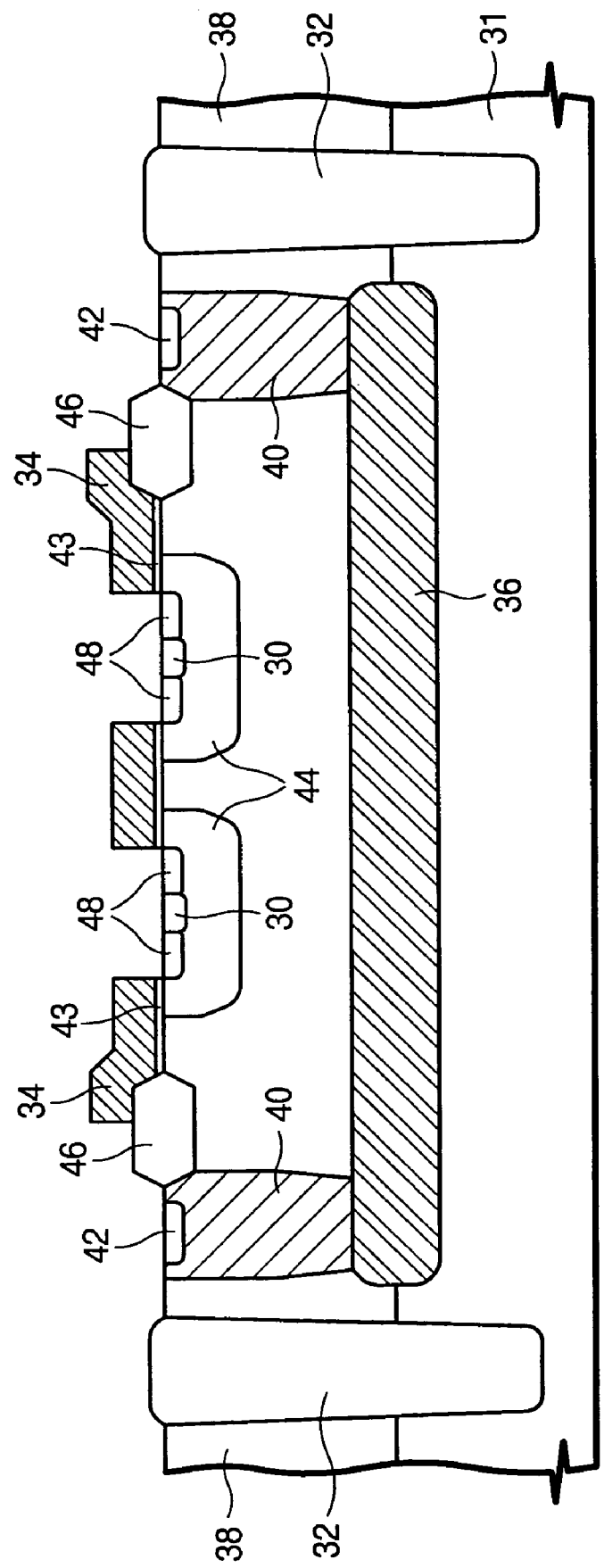
FIG. 2 is a sectional view of a DMOS device having a trench device isolation structure introduced to overcome the problems of the junction isolation technology.

Reference will now be made in detail to the preferred embodiments of the present invention, examples of which are illustrated in the accompanying drawings. However, the present invention is not limited to the embodiments illustrated hereinafter. Instead, the embodiments described herein are introduced in order to provide a complete understanding of the scope and spirit of the present invention. The thickness of the layers and regions in the drawings is exaggerated in order to clearly show the device structure. In references to a particular layer being formed on another layer or on a substrate, that layer can be directly formed on another layer or on a substrate, or a third layer may be interposed therebetween. Wherever possible, the same reference numbers will be used throughout the drawings to refer to the same or like parts.

Figure 3:
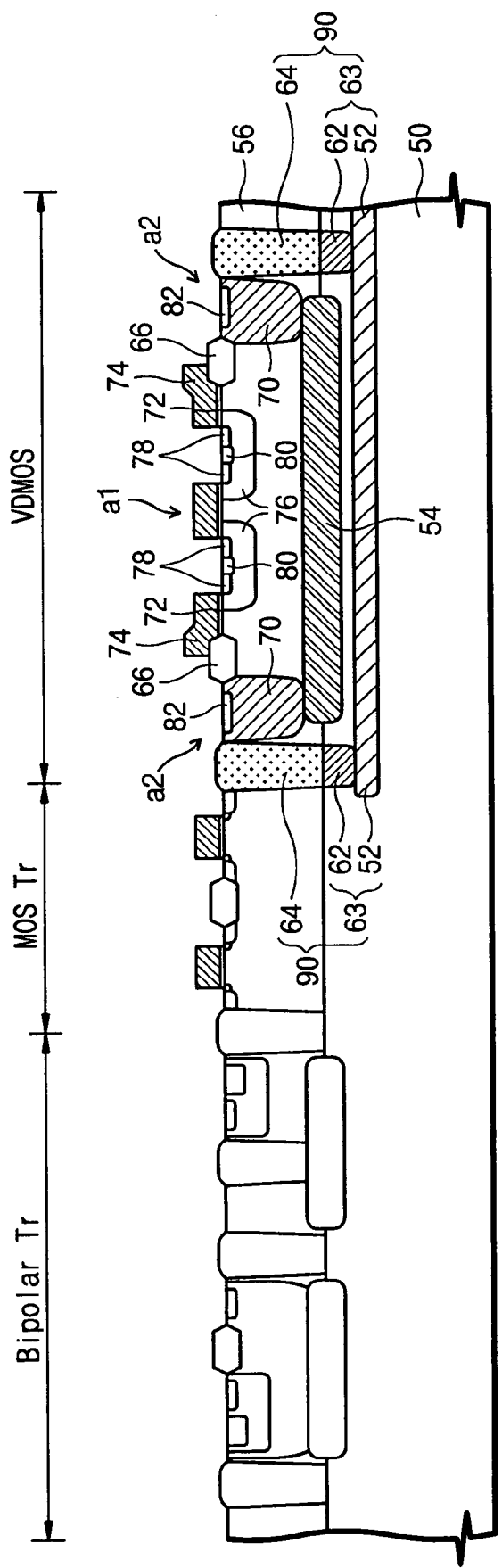
FIG. 3 is a schematic sectional view of a portion of a power IC having the DMOS device according to a preferred embodiment of the present invention.

FIG. 3 is a schematic representation of a portion of the power IC having a DMOS device according to one embodiment of the present invention.

Figure 4:
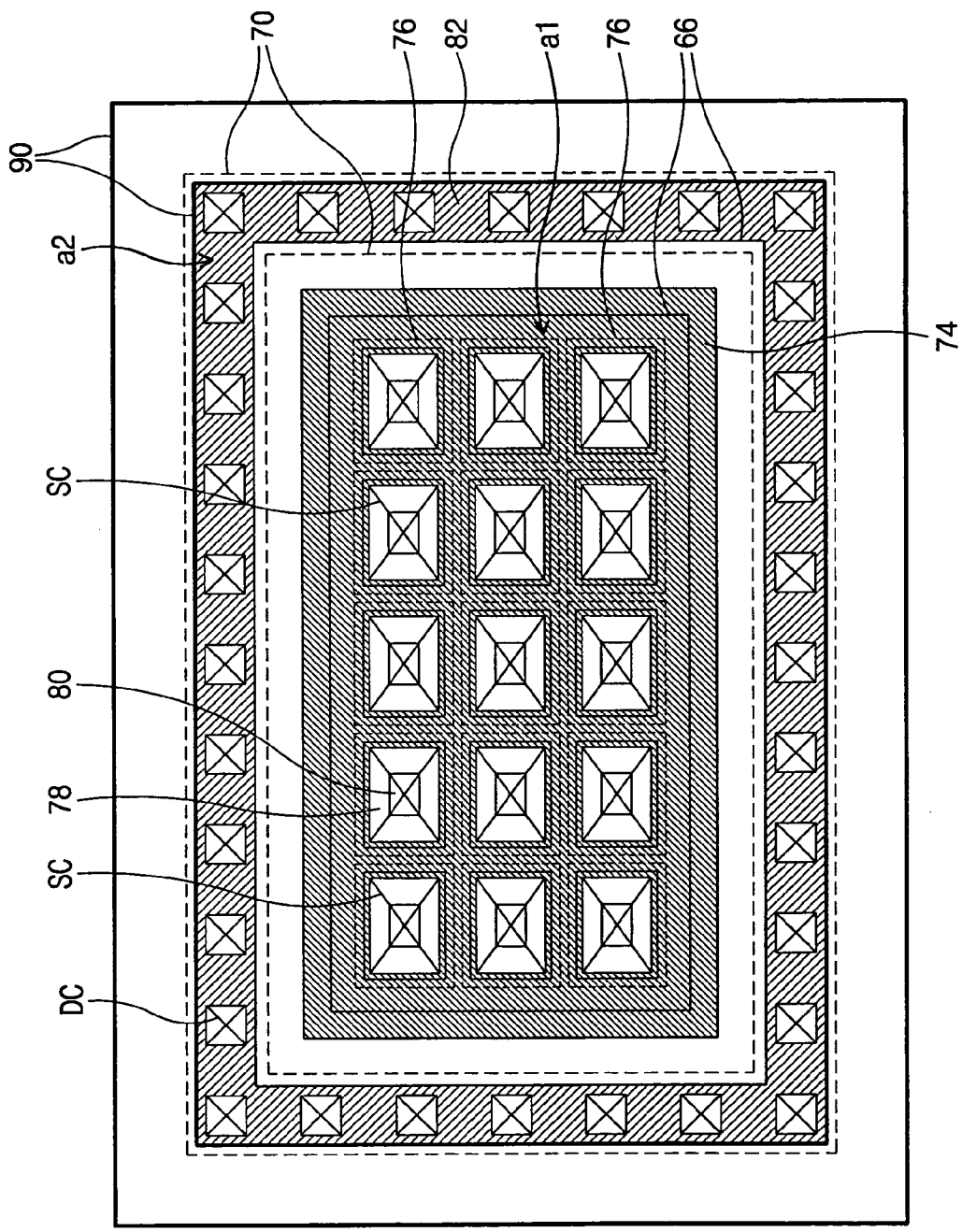
FIG. 4 is a plane view of the DMOS device according to a preferred embodiment of the present invention.

FIG. 4 is a plane view of the DMOS device according to one embodiment of the present invention.

Referring to FIGS. 3 and 4, the power IC includes various devices that operate at high frequency and high voltages. As shown in the drawings, the power IC includes a MOS transistor (MOS Tr.), a bipolar transistor (Bipolar Tr.), a double diffused MOS transistor (DMOS Tr.), etc. Recently, the power IC primarily employs a vertical double diffused MOS (VDMOS) device having excellent performance characteristics in a relatively small chip area. Each device is isolated from neighboring devices by a device isolation structure having a high breakdown voltage.

The DMOS device of the present invention includes a first conductivity type buried layer 54 formed on a predetermined region of a semiconductor substrate 50. A first conductivity type epitaxial layer 56 is formed over the buried layer 54 and the entire surface of a semiconductor substrate 50. The buried layer 54 is formed of an impurity diffused layer wherein phosphorus (P), arsenic (As), antimony (Sb) are diffused into the semiconductor substrate 50 with a predetermined thickness. In addition, the buried layer 54 is formed to be diffused into the epitaxial layer 56 with predetermined thickness. The epitaxial layer 56 also has an n-type conductivity type impurity including phosphorus (P), arsenic (As), antimony (Sb). The epitaxial layer 56 is more lightly doped than the buried layer 54. A device isolation structure 90 is placed to penetrate the epitaxial layer 56 and a portion of the semiconductor substrate to define the device region of the DMOS device. The device isolation structure 90 includes a diffused isolation layer 63 formed at the semiconductor substrate 50 and surrounding the lower side of the device region, and a trench isolation structure 64 formed at the epitaxial layer 56 and surrounding the upper sidewall of the device region. The diffused isolation layer 63 is formed to be an impurity diffused layer having a second conductivity type impurity that is diffused into the semiconductor substrate 50. For example, the diffused isolation layer 63 is formed to be an impurity diffused layer including boron (B), boronfluoric ($BF_2$), indium (In). The diffused isolation layer 63 includes a diffused bottom isolation layer 52, and a diffused isolation wall 62. The diffused bottom isolation layer 52 is formed along the base of the device region, and the diffused isolation wall 62 surrounds the bottom sidewall of the device region and is connected to the diffused bottom isolation layer 52. That is, the diffused isolation layer 63 operates to isolate the semiconductor substrate region of the device region from the surrounding semiconductor substrate. The diffused bottom isolation layer 52 may extend horizontally down to a neighboring DMOS device or to the bottom of a device region on which a high voltage control circuit will be formed.

A field oxide layer 66 is placed on a predetermined region of the device region defined by the device isolation structure 90 to define a first active area a1 and a second active area a2. The first active area a1 is the region surrounded by the field oxide layer 66, and the second active area a2 is the region between the field oxide layer 66 and the device isolation structure 90. The field oxide layer 66 is formed by using LOCOS technology.

A gate electrode 74 is placed on the first active area a1. A gate insulating layer 72 is interposed between the gate electrode 74 and the first active area a1. The gate electrode 74 has an overlapped region with the field oxide layer 66.

As shown in FIG. 4, the gate electrode 74 may have a mesh-shaped structure in a typical DMOS device. That is, the gate electrode 74 has a plurality of openings to expose the first active area a1. A source region is formed in the first active area a1 exposed on the opening, and a drain region is formed in the second active area a2. The source region includes the first conductivity type diffused layer 78 and the second conductivity type body region 76. The first conductivity type diffused layer 78 is formed in the first active area a1 adjacent to the gate electrode 74. The second conductivity type body region 76 is more deeply diffused than the first conductivity type diffused layer 78, surrounding the first conductivity type diffused layer 78, and has an overlapped region with the gate electrode 74. That is, the first conductivity type diffused layer 78 is formed on the surface of the second conductivity type body region 76. The source region may further include the second conductivity type diffused layer 80 on the surface of the second conductivity type body region 76 to prevent the parasitic bipolar transistor from turning on in the DMOS device. For example, the first conductivity type diffused layer 78 is formed on the peripheral region of the first active area a1 exposed on the opening to have a loop structure, and the second conductivity type diffused layer 80 is formed in the region surrounded by the loop structure. The second conductivity type diffused layer 80 is more heavily doped than the body region 76.

The field oxide layer 66 is formed on the device region spaced apart from the device isolation structure 90. The field oxide layer 66 is loop-shaped and defines the first active area a1 in the region surrounded by the field oxide layer 66, and defines the second active area a2 between the field oxide layer 66 and the device isolation structure 90. The drain region is formed in the second active area a2, and includes a first conductivity type sink region 70 which is formed in the second active area a2 and vertically connected with the buried layer 54, and a heavily doped region 82 formed on the surface of the second active area a2 having the sink region 70 formed thereon. The drain region and the source region are connected to a drain electrode (DC) and a source electrode (SC) respectively. Since the source electrode (SC) is commonly connected to the first conductivity type diffused layer 78 and the second conductivity type diffused layer 80, the parasitic bipolar transistor is restricted to turn on while the DMOS is operated.

As described above, the device isolation structure of the present invention has a dual structure of a trench device isolation structure formed on the diffused isolation layer and the epitaxial layer on the semiconductor substrate. For this reason, formation of the trench device isolation structure of the present invention is relatively simple, and the area occupied by the device isolation structure can be reduced as compared with the junction isolation structure.

FIGS. 5 to 13 are sectional views that illustrate a process of fabricating a DMOS device according to one preferred embodiment of the present invention.

Figure 5:
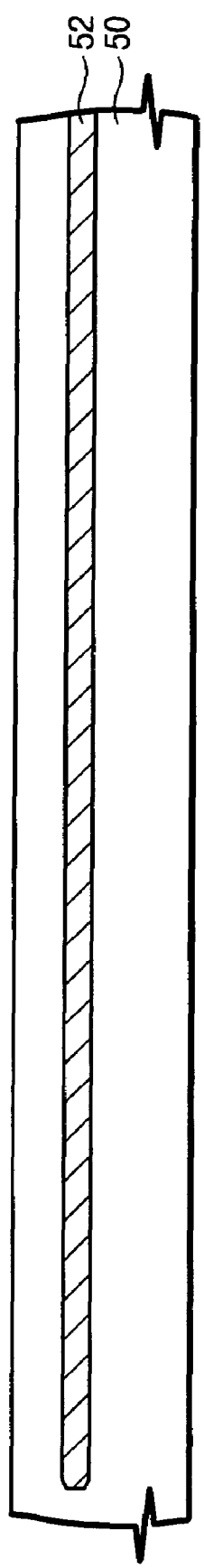
FIGS. 5 to 13 are sectional views of the fabricating process of the DMOS device according to a preferred embodiment of the present invention.
Figure 6:
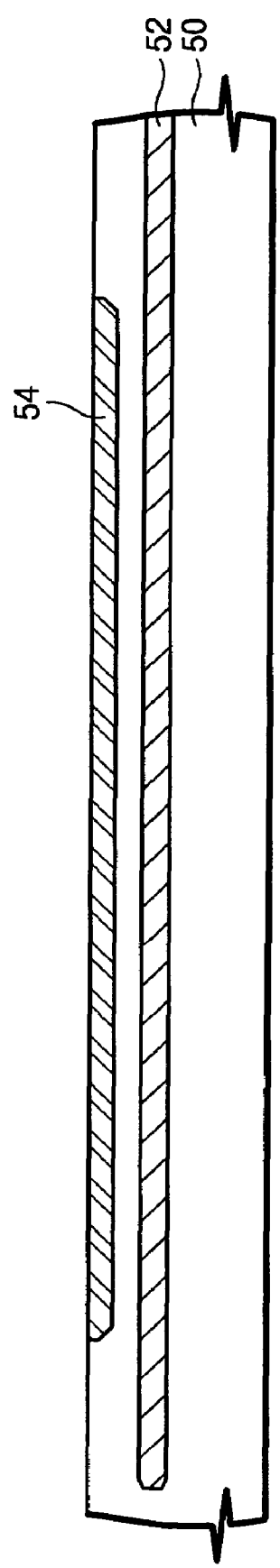

Referring to FIGS. 5 and 6, a second conductivity type impurity is implanted into a predetermined region of the semiconductor substrate 50 to form the diffused bottom isolation layer 52. The diffused bottom isolation layer 52 can be formed by implanting a p-type impurity such as boron (B), boronfluoric ($BF_2$), indium (In) into the semiconductor substrate 50. For example, the boron may be implanted into the semiconductor substrate 50 with a flux density of $1 \times 10^{14}/cm^2$ to $1 \times 10^{15}/cm^2$. Then, a first conductivity type impurity is implanted to the surface of the semiconductor substrate on the diffused bottom isolation layer 52 to form a first conductivity type buried layer 54. The buried layer 54 can be formed by implanting an n-type impurity such as phosphorus (P), arsenic (As), antimony (Sb) into a predetermined region of the upper side of the diffused bottom isolation layer 52 with a high flux density.

Figure 7:
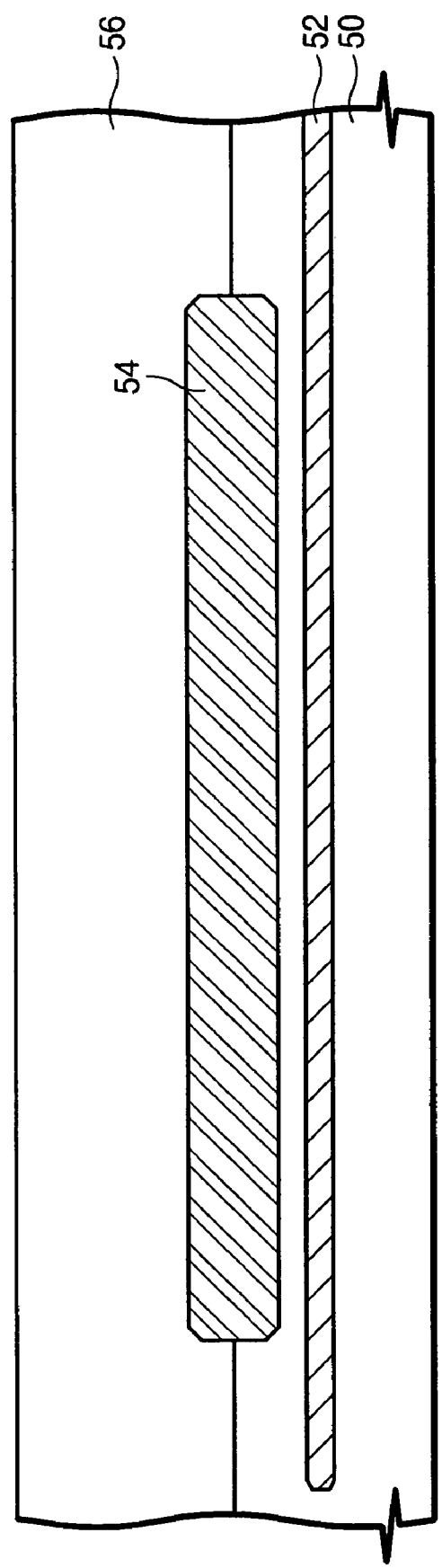

Referring to FIG. 7, a first conductivity type epitaxial layer 56 is grown on the buried layer 54 and the entire surface of the semiconductor substrate 50. The epitaxial layer 56 can be formed with a thickness of about 10 μm. While the epitaxial layer 56 is grown, the first conductivity type buried layer 54 is externally diffused down to the epitaxial layer 56 and the semiconductor substrate 50. Accordingly, the buried layer 54 may have a thickness of about 3 μm to 10 μm. Adding to this, the buried layer 54 can be diffused by using a thermal process on the substrate before or after forming the epitaxial layer 56. The epitaxial layer 56 is preferably doped with a lower density than the buried layer 54.

Figure 8:
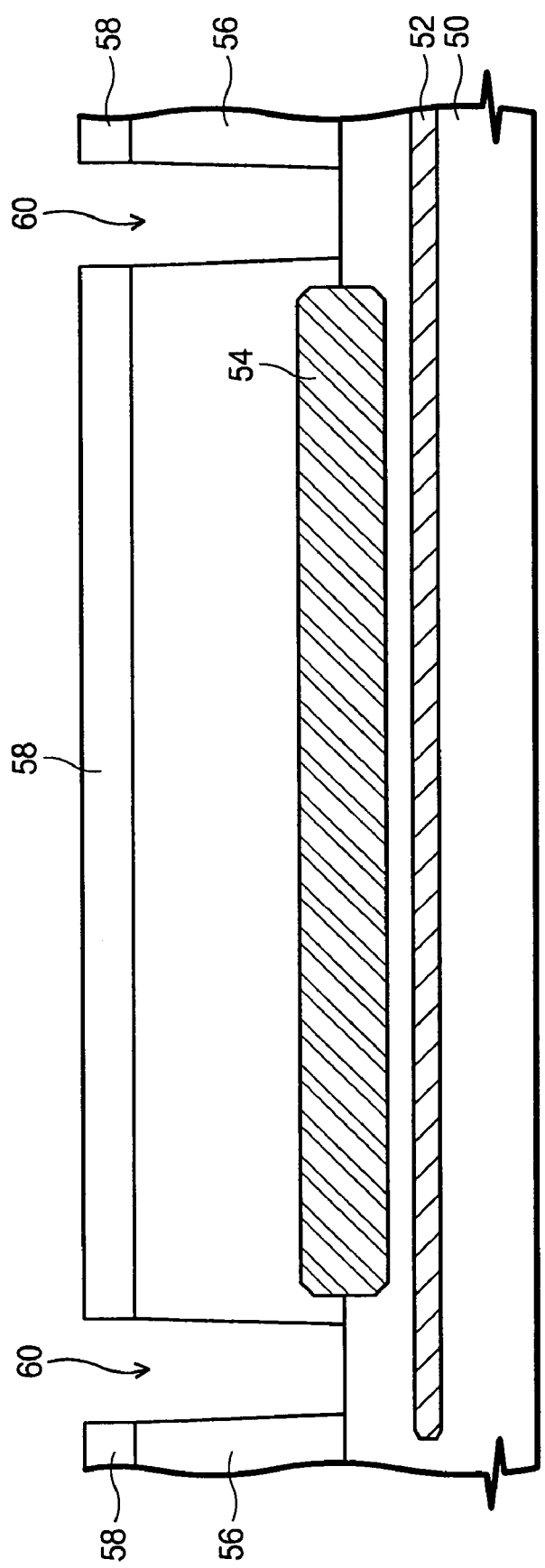
Figure 9:
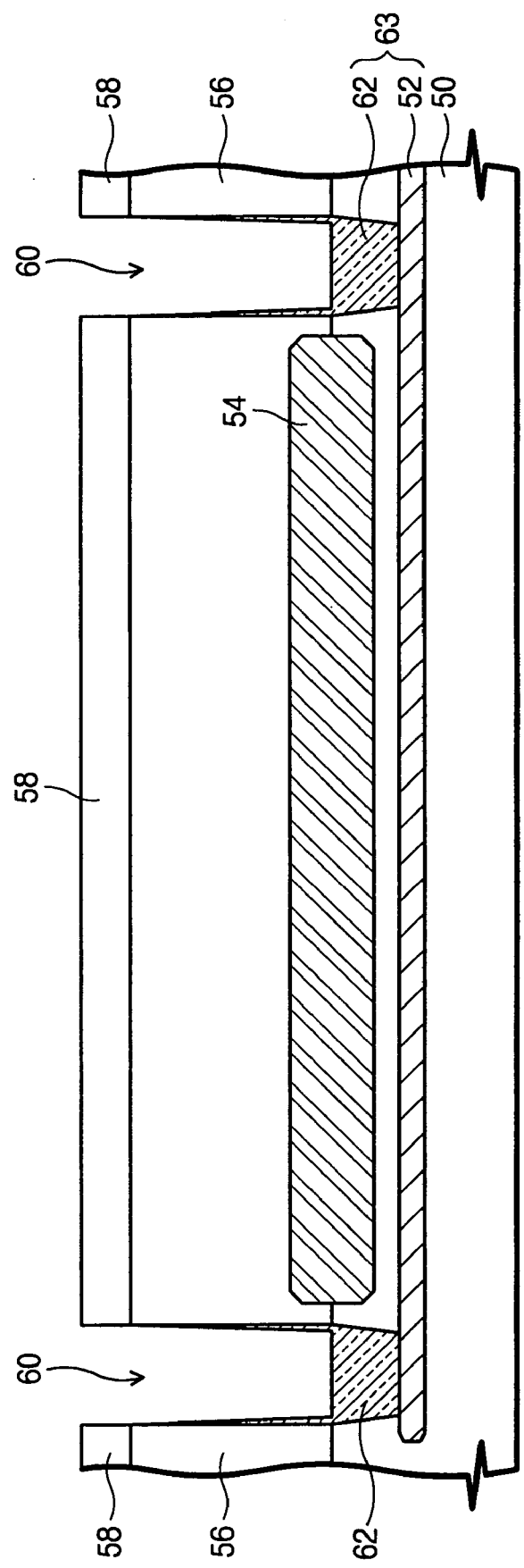

Referring to FIGS. 8 and 9, a hard mask pattern 58 is formed on the epitaxial layer 56, and the epitaxial layer 56 is etched by using the hard mask pattern 58 as an etch mask so as to form a trench 60 to expose a predetermined region of the semiconductor substrate 50. The trench 60 is formed as a loop shape surrounding a predetermined region of the epitaxial layer 56. Then, a second conductivity type impurity is implanted into the semiconductor substrate 50 which is exposed at the bottom of the trench 60 by using the hard mask pattern 58 as an ion implantation mask. As a result, a diffused isolation wall 62 is formed in the semiconductor substrate 50. The diffused isolation wall 62 is connected to the diffused bottom isolation layer 52 so as to form a diffused isolation layer 63 to isolate a predetermined region of the semiconductor substrate 50 from its surrounding semiconductor substrate. That is, the diffused isolation layer 63 surrounds the sidewall and the base of a predetermined region of the semiconductor substrate 50. The hard mask pattern 58 is preferably formed of a silicon nitride layer. A buffer oxide layer may be further formed between the hard mask pattern 58 and the epitaxial layer 56.

Figure 10:
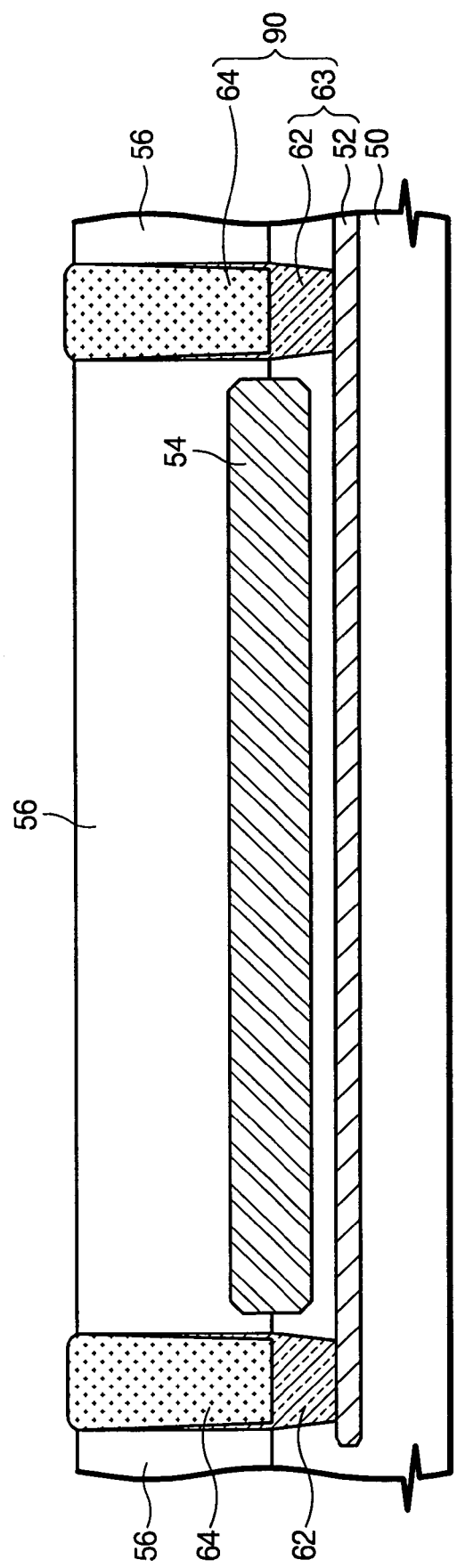

Referring to FIG. 10, an insulating layer is formed on the upper side of the epitaxial layer to fill the trench, and a trench isolation structure 64 is formed inside the trench by grinding the insulating layer by a chemical and mechanical grinding process. Then, the hard mask pattern 58 is removed to expose the epitaxial layer 56. The trench isolation structure is formed by using a typical shallow trench isolation technology. The insulating layer selected to fill the inside of the trench is preferably one that has excellent step coverage, and for example, PEOX (plasma enhanced oxide), or HDP oxide layer (high density plasma oxide) can be used. The device isolation structure 90 includes the diffused isolation layer 63 and the trench isolation structure 64. The region surrounded by the device isolation structure 90 is a device region.

Figure 11:
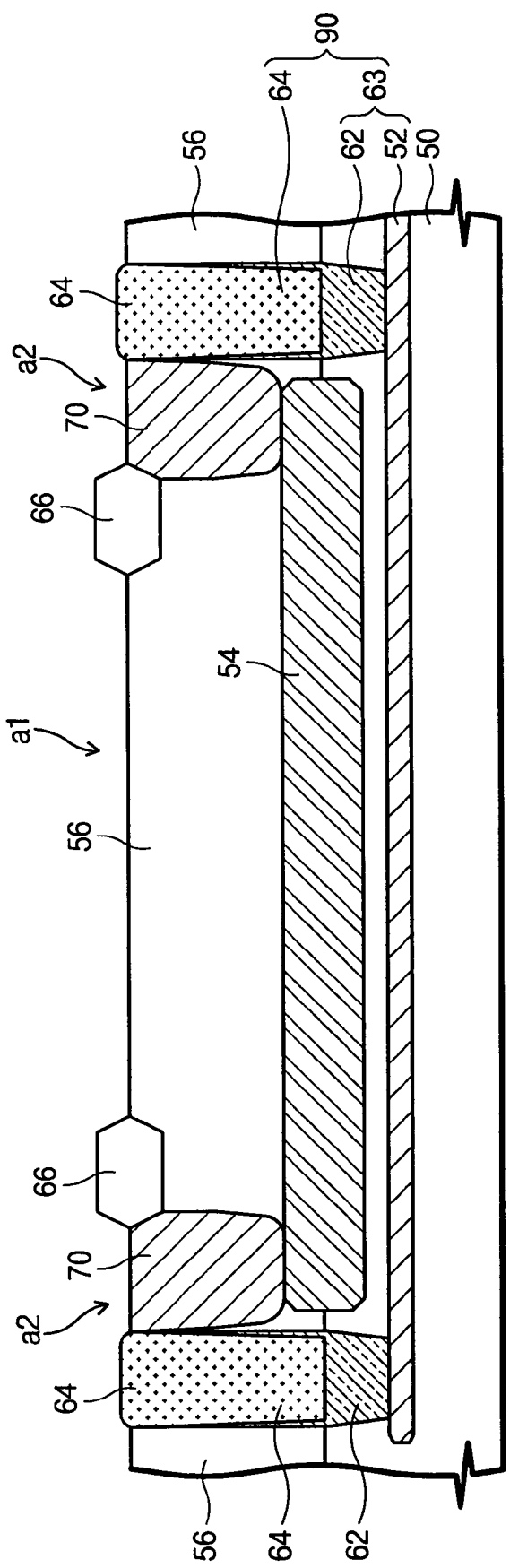

Referring to FIG. 11, a field oxide layer 66 is formed on the epitaxial layer 56 of the device region so as to define the first active area a1 and the second active area a2. The field oxide layer 66 is formed as a loop shape spaced apart from the device isolation structure 90. The region surrounded by the field oxide layer 66 is the first active area a1, and the region between the field oxide layer 66 and the device isolation structure 90 is the second active area a2. The field oxide layer can be formed by using a typical LOCOS process. A first conductivity type impurity is implanted into the second active area a2 so as to form a sink region 70 connected to the buried layer 54. The sink region 70 may be formed after or before forming the field oxide layer 66. In case of forming the sink region 70 before forming the field oxide layer 66, a thermal oxidation process to form the field oxide layer 66 may be performed, and during the process, the resistance of the sink region 70 can be reduced. However, in case of forming the sink region 70 after forming the field oxide layer 66, the thermal process is preferably performed on the substrate having the sink region after forming the sink region 70 to reduce the resistance of the sink region 70.

The sink region 70 can be formed by implanting an n-type impurity into the epitaxial layer 56. That is, phosphorus (P), arsenic (As), antimony (Sb) can be implanted into the epitaxial layer 56 so as to form the sink region 70. It is preferable to dope the sink region 70 with a higher density than the epitaxial layer. For example, the implantation can be performed with 100 KeV to 500 KeV of energy and $1 \times 10^{14}/cm^2$ to $5 \times 10^{15}/cm^2$ of flux density into the epitaxial layer 56 to form the sink region 70.

Figure 12:
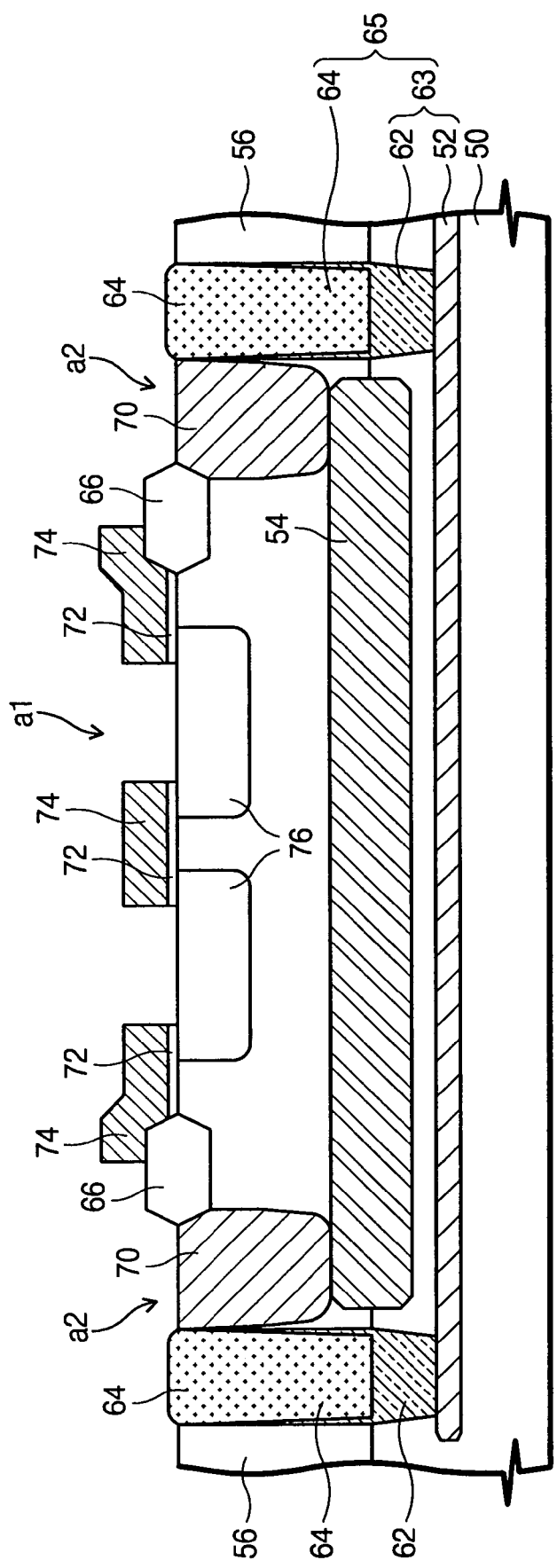

Referring to FIG. 12, a gate pattern 74 is formed on the first active area. The gate pattern 74 may have an overlapped region with the upper side of the field oxide layer 66. In addition, the gate pattern 74 may be formed, as shown in FIG. 4, as a mesh-shaped structure having a plurality of openings exposed at predetermined regions of the first active area a1. Accordingly, the DMOS device has a plurality of source cells so as to increase the power drive characteristic. A gate insulating layer 72 is interposed between the gate electrode 74 and the first active area a1. Sequentially, a second conductivity type impurity is implanted into the first active area a1 by using the photoresist pattern (not shown) to expose the first active area a1, and the gate electrode 74 as an ion implantation mask. Then, a thermal process is performed on the substrate on which the impurity is implanted so as to form a second conductivity type body region 76 in the first active area a1 exposed at the opening. The body region 76 is diffused down to the gate electrode 74 and has an overlapped region with the lower side of the gate electrode 74. The body region 76 may be formed by implanting a p-type impurity such as boron (B), boronfluoric ($BF_2$), indium (In), etc.

Figure 13:
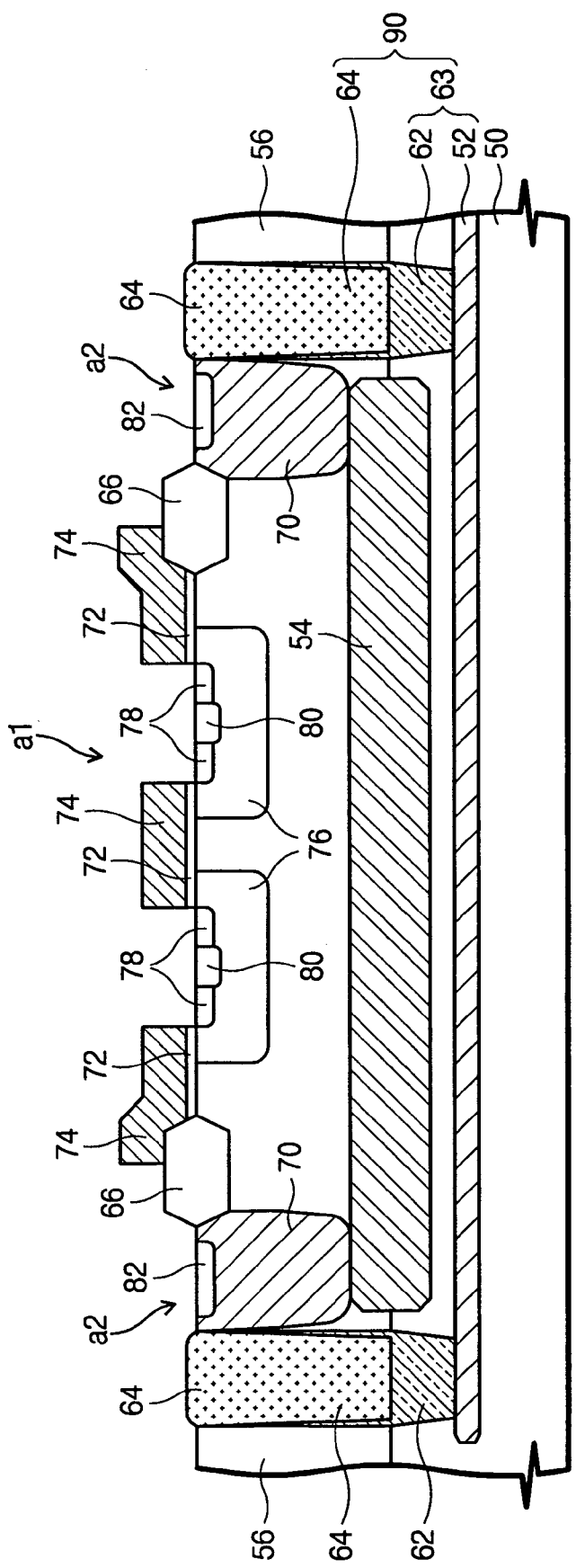

Referring to FIG. 13, a first conductivity type impurity is implanted into the surface of the first active area a1 and the second active area a2 exposed inside the opening formed on the gate pattern 74. As a result, the first conductivity type diffused layer 78 is formed on the surface of the first active area a1, and the heavily doped first conductivity type region 82 is formed on the surface of the second active area a2. The first conductivity type diffused layer may be formed as a loop shape on the peripheral region of the opening adjacent to the gate electrode by using the photoresist pattern (not shown). The first conductivity type diffused layer 78 and the heavy doped region 82 can be formed by implanting an n-type impurity such as phosphorus (P), arsenic (As), antimony (Sb). At this point, it is preferable to dope the first conductivity type diffused layer 78 and the heavily doped diffused layer 82 with a higher density than the epitaxial layer 56. In addition, the heavily doped diffused layer 82 is preferably doped with a higher density than the sink area 70.

A heavily doped second conductivity type diffused layer 80 is preferably formed on the surface of the body region 76 to prevent the turning-on of the parasitic bipolar transistor during the operation of the DMOS device so as to connect the first conductivity type diffused layer 78 and the second conductivity type diffused layer 80 with a common electrode. For example, in case of forming the first conductivity type diffused layer 78 as a loop shape, a second conductivity type impurity is implanted on the region surrounded by the first conductivity type diffused layer 78 so as to form the second conductivity type diffused layer 80. The second conductivity type diffused layer can be formed by implanting a p-type impurity such as boron (B), boronfluoric ($BF_2$), indium (In). At this point, preferably, the second conductivity type diffused layer 80 is doped with a higher density than the second conductivity type body region 76. The first conductivity type diffused layer 78 and the second conductivity type diffused layer 80 can be formed on the surface of the body region 76 with various shapes.

The first conductivity type diffused layer 78, the second conductivity type diffused layer 80, and the second conductivity type body region 76 form the source region of the DMOS transistor. In addition, the sink region 70 and the heavily doped first conductivity type region 82 form the drain region of the DMOS transistor.

Even though further drawings are not shown here, by using a typical method of fabricating a semiconductor device, the gate electrode, and the source electrode and the drain electrode which are connected to the source region and the drain region respectively can be formed. At this point, the source electrode can be commonly connected to the first conductivity type diffused layer and the second conductivity type diffused layer. As set forth before, the present invention provides a device isolation structure for a semiconductor device having excellent device isolation characteristics and reduced area size, by providing a dual device isolation structure. In this manner, the present invention addresses the limitations associated with the conventional semiconductor device having a junction device isolation structure, which requires a relatively large amount of area for the device isolation region due to the external diffusion. The present invention further provides a semiconductor device having a deep device isolation structure by solving the difficulties in the conventional device isolation structure in forming a trench isolation structure at a depth of over 15 µm. As a result, the device isolation ability of the semiconductor device operated at high frequency and high voltage can be greatly improved, while reducing the area occupied by the isolation structure.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating a semiconductor device comprising the steps of:
    implanting a second conductivity type impurity into a predetermined region of a semiconductor substrate to form a diffused bottom isolation layer;
    forming a second conductivity type epitaxial layer on the semiconductor substrate;
    patterning the epitaxial layer to form a trench exposing a predetermined region of the semiconductor substrate;
    implanting the second conductivity type impurity into the lower portion of the trench to form a diffused isolation wall in the semiconductor substrate that is connected to the diffused bottom isolation layer; and
    filling an insulating layer in the trench to form a trench isolation structure in contact with the diffused isolation wall, wherein the trench isolation structure, the diffused isolation wall and the diffused bottom isolation layer define a device region including the semiconductor substrate and the epitaxial layer.

2. The method of claim 1, further comprises the step of implanting a first conductivity type impurity onto the surface of the semiconductor substrate on the upper side of the diffused bottom isolation layer to form a first conductivity type buried layer prior to forming the epitaxial layer, wherein the buried layer is spaced apart from the diffused bottom isolation layer and the diffused isolation wall.

3. The method of claim 1, after the step of forming the trench isolation structure, further comprising the steps of:
    forming a field oxide layer on the device region to define a first active area and a second active area;
    forming a gate electrode on the first active area;
    forming a source region in the first active area beside the gate electrode; and
    forming a drain region in the second active area connected to the buried layer.

4. The method of claim 1, wherein the step of forming the trench, the diffused isolation wall, and the trench isolation structure comprises the steps of:
    forming a hard mask pattern on the epitaxial layer;
    forming a trench by etching the epitaxial layer by using the hard mask pattern as an etch mask, and exposing a predetermined region of the semiconductor substrate;
    implanting a second conductivity type impurity into the bottom of the trench by using the hard mask pattern as an ion implantation mask;
    forming an insulating layer in the trench; and
    removing the hard mask pattern.

5. A method of fabricating a semiconductor device comprising the steps of:
    implanting a second conductivity type impurity into a predetermined region of a semiconductor substrate to form a diffused bottom isolation layer;
    implanting a first conductivity type impurity into the surface of the semiconductor substrate over the diffused bottom isolation layer to form a first conductivity type buried layer;
    forming a second conductivity type epitaxial layer covering the buried layer and the semiconductor substrate;
    patterning the epitaxial layer to form a trench surrounding a predetermined region of the epitaxial layer, the trench exposing a predetermined region of the semiconductor substrate;
    implanting the second conductivity type impurity into the lower side of the trench to form a diffused isolation wall connected to the diffused bottom isolation layer to surround a predetermined region of the semiconductor substrate;
    filing an insulating layer in the trench to form a trench isolation structure in contact with the diffused isolation wall;
    forming a field oxide layer to define a first active area and a second active area on the upper side of the epitaxial layer surrounded by the trench isolation structure, wherein the first active area is surrounded by the field oxide layer, and the second active area is interposed between the field oxide layer and the trench isolation structure;

forming a gate electrode and a source region on the first active area; and forming a drain region in the second active area, wherein the trench isolation structure, the diffused isolation wall and the diffused bottom isolation layer define the device region comprising the semiconductor substrate and the epitaxial layer sequentially deposited.

6. The method of claim 5, wherein the first conductivity type impurity is one selected from a group consisting of phosphorus (P), arsenic (As) and antimony (Sb).

7. The method of claim 5, wherein the second conductivity type impurity is one selected from a group consisting of boron (B), boronfluoric ($BF_2$) and indium (In).

8. The method of claim 5, wherein the gate electrode overlaps the field oxide layer.

9. The method of claim 5, wherein the gate electrode is mesh-shaped structure having a plurality of openings exposing a predetermined region of the first active area.

10. The method of claim 5, wherein the step of forming the source region comprises the steps of:

implanting the second conductivity type impurity into the first active area exposed at the opening to form a second conductivity type body region having an overlapped region with the lower side of the gate electrode;

implanting a first conductivity type impurity into the peripheral region of the first active area exposed at the opening to form a first conductivity type diffused layer adjacent to the gate electrode; and implanting the second conductivity type impurity into the region surrounded by the first conductivity type diffused layer inside the opening to form a second conductivity type diffused layer spaced apart from the gate electrode.

11. The method of claim 10, wherein the second conductivity type diffused layer is more heavily doped than the body region.

12. The method of claim 5, wherein the step of forming the drain region comprises the steps of:

implanting a first conductivity type impurity into the second active area to form a sink region vertically connected to the buried layer; and implanting a first conductivity type impurity on the surface of the second active area to form a heavily doped diffused layer.

13. The method of claim 12, wherein the heavily doped diffused layer is more heavily doped than the sink region.

14. The method of claim 12, wherein the sink region is formed before forming the field oxide layer.

15. The method of claim 12, wherein the sink region is formed after forming the field oxide layer.

16. The method of claim 12, wherein a thermal treatment process is performed for the semiconductor substrate after forming the sink region to decrease the resistance of the sink region.

17. The method of claim 5, wherein the step of forming the trench, the diffused isolation wall and the trench isolation structure comprises the steps of:

forming a hard mask pattern on the epitaxial layer;

etching the epitaxial layer by using the hard mask pattern as an etch mask to form a trench exposing a predetermined region of the semiconductor substrate;

implanting a second conductivity type impurity into the bottom of the trench by using the hard mask pattern as an etch implantation mask;

forming an insulating layer inside the trench; and removing the hard mask pattern.

* * * * *